(12) United States Patent
Lin et al.

(10) Patent No.: US 12,021,125 B2
(45) Date of Patent: Jun. 25, 2024

(54) HIGH SELECTIVITY ETCHING WITH GERMANIUM-CONTAINING GASES

(71) Applicant: Taiwan Semiconductor Manufacturing Co., Ltd., Hsinchu (TW)

(72) Inventors: Tze-Chung Lin, Hsinchu (TW); Pinyen Lin, Rochester, NY (US); Fang-Wei Lee, Hsinchu (TW); Li-Te Lin, Hsinchu (TW); Han-Yu Lin, Nantou County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 201 days.

(21) Appl. No.: 17/377,861

(22) Filed: Jul. 16, 2021

(65) Prior Publication Data

US 2023/0017512 A1    Jan. 19, 2023

(51) Int. Cl.
*H01L 29/417* (2006.01)
*H01L 21/3065* (2006.01)
*H01L 29/06* (2006.01)
*H01L 29/423* (2006.01)
*H01L 29/66* (2006.01)
*H01L 29/786* (2006.01)

(52) U.S. Cl.
CPC .... *H01L 29/41775* (2013.01); *H01L 21/3065* (2013.01); *H01L 29/0665* (2013.01); *H01L 29/42392* (2013.01); *H01L 29/66553* (2013.01); *H01L 29/78696* (2013.01)

(58) Field of Classification Search
CPC ........... H01L 29/41775; H01L 21/3065; H01L 29/0665; H01L 29/42392; H01L 29/66553; H01L 29/78696; H01L 29/0673; H01L 29/66439; H01L 29/165; H01L 29/7848; H01L 29/66545; H01L 29/775; H01L 29/0657; H01L 29/785; B82Y 10/00
USPC ....................................................... 257/401
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |

(Continued)

*Primary Examiner* — Tong-Ho Kim
(74) *Attorney, Agent, or Firm* — Sterne, Kessler, Goldstein & Fox P.L.L.C.

(57) ABSTRACT

The present disclosure describes a method includes forming a fin structure including a fin bottom portion and a stacked fin portion on a substrate. The stacked fin portion includes a first semiconductor layer and a second semiconductor layer, in which the first semiconductor layer includes germanium. The method further includes etching the fin structure to form an opening, delivering a primary etchant and a germanium-containing gas to the fin structure through the opening, and etching a portion of the second semiconductor layer in the opening with the primary etchant and the germanium-containing gas.

20 Claims, 11 Drawing Sheets

(56) References Cited

U.S. PATENT DOCUMENTS

| | | | |
|---|---|---|---|
| 2020/0044087 A1* | 2/2020 | Guha | H01L 29/66439 |
| 2021/0098631 A1* | 4/2021 | Fung | H01L 21/30604 |

* cited by examiner

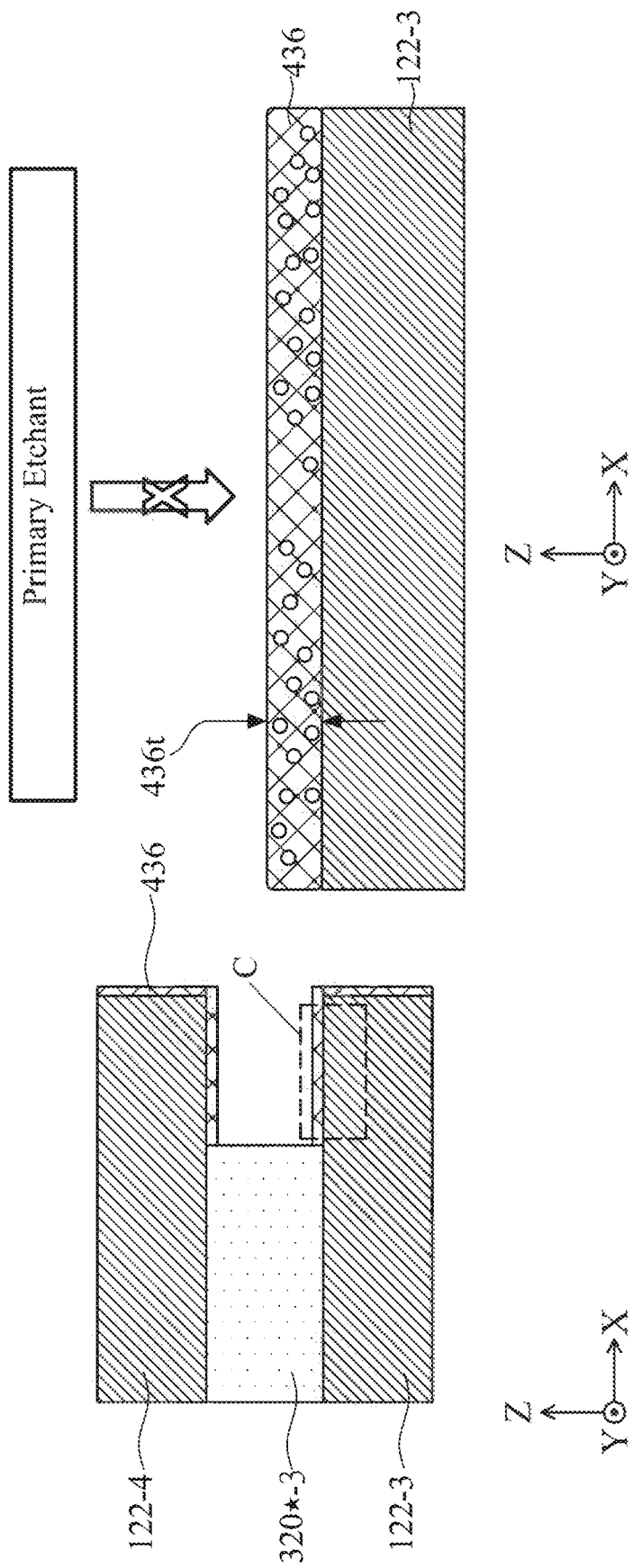

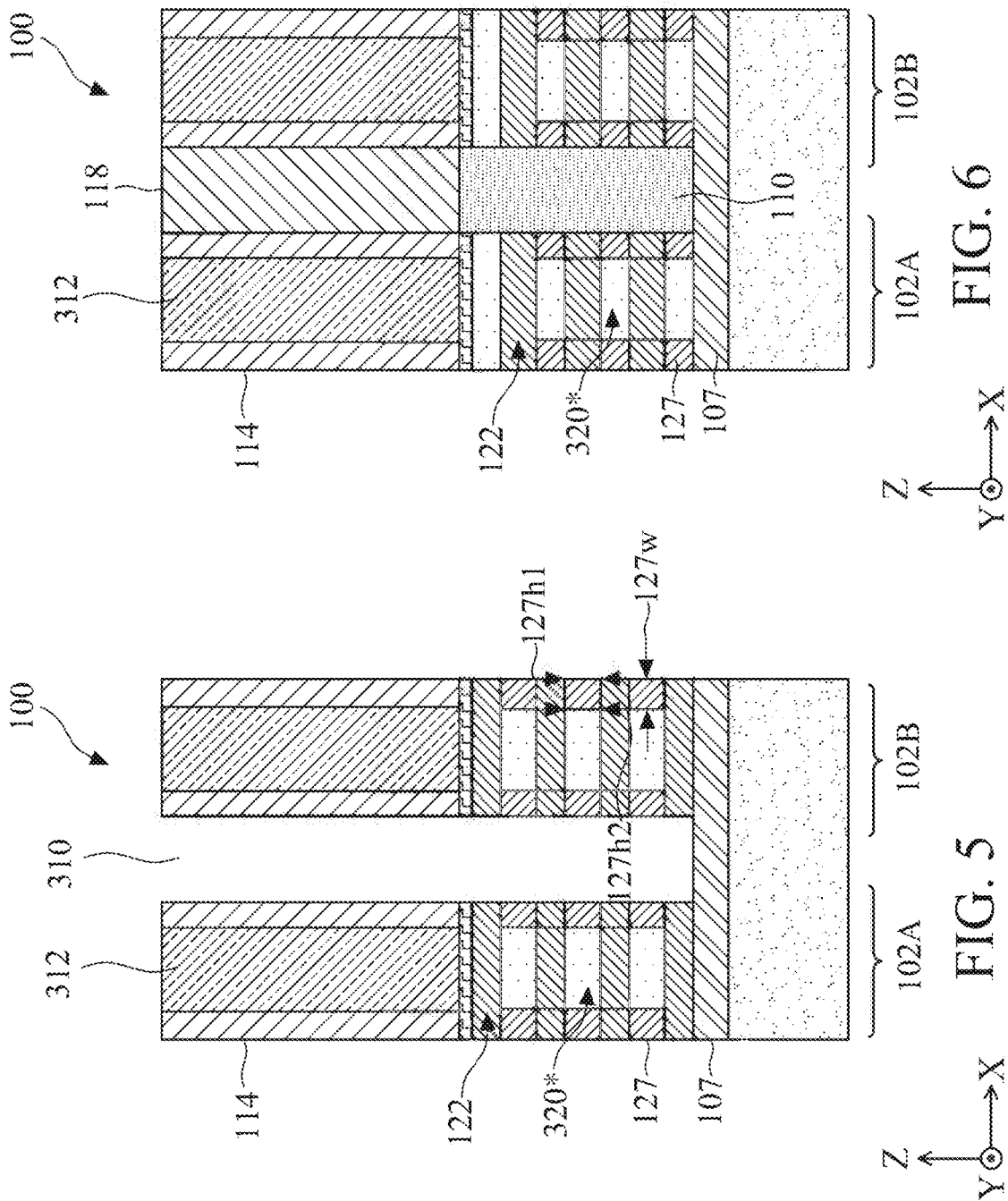

HIGH SELECTIVITY ETCHING WITH GERMANIUM-CONTAINING GASES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIGS. 3, 4A-4F, 5-7, and 8A-8D illustrate partial cross-sectional views of a semiconductor device formed by high selectivity etching with a germanium-containing gas at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1B:
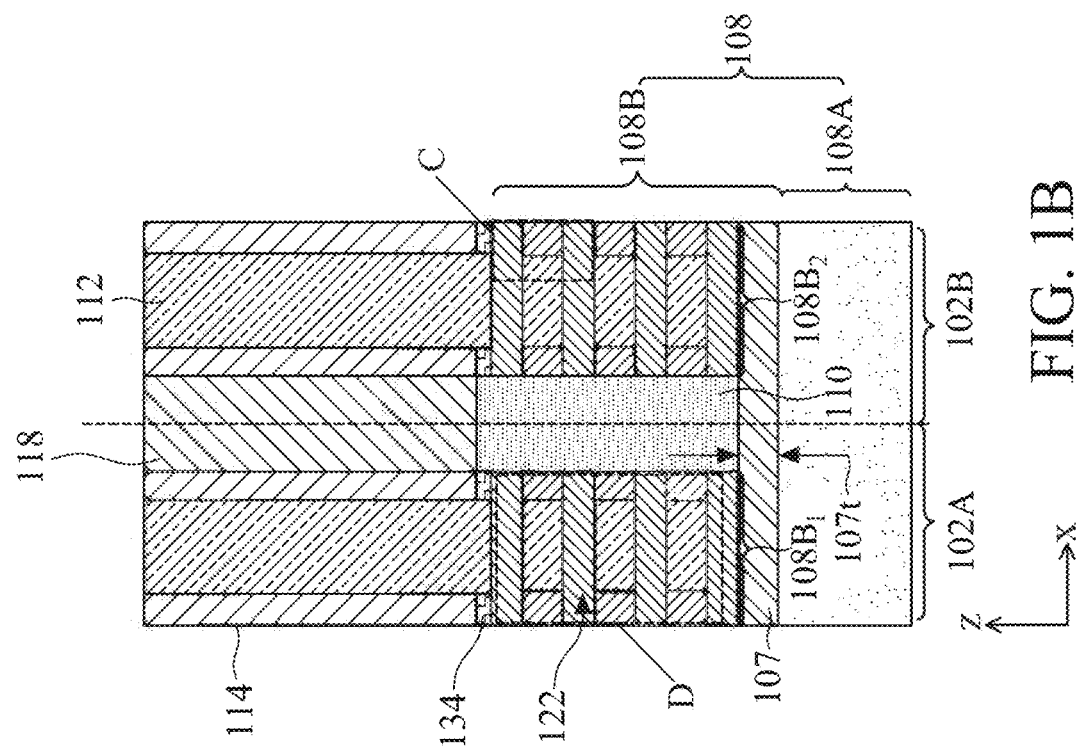
FIGS. 1A-1D illustrate an isometric view and partial cross-sectional views of a semiconductor device formed by high selectivity etching with a germanium-containing gas, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With advances in semiconductor technology, multi-gate devices have been introduced in an effort to improve gate control by increasing gate-channel coupling, reduce off-state current, and reduce short-channel effects (SCEs). One such multi-gate device is the gate-all-around fin field effect transistor (GAA finFET). The GAA finFET device provides a channel in a stacked nanosheets/nanowires configuration. The GAA finFET device derives its name from the gate structure that can extend around the channel and provide gate control of the channel on multiple sides of the channel. GAA finFET devices are compatible with MOSFET manufacturing processes and their structure allows them to be scaled while maintaining gate control and mitigating SCEs.

With increasing demand for lower power consumption, high performance, and small area (collectively referred to as "PPA") of semiconductor devices, GAA finFET devices can have their challenges. For example, the channel of GAA finFET devices formed by silicon (Si) nanosheet/nanowires have lower hole mobility than the channel formed by nanosheets/nanowires including germanium (Ge). Germanium-containing nanosheet/nanowires (e.g., SiGe or Ge) are desired for higher mobility GAA finFET devices. Si to SiGe (or Ge) selective etching can have SiGe and Ge loss problems during etching of Si and low Si to SiGe etch selectivity (e.g., less than about 10). Loss of SiGe and Ge can reduce the dimensions of Ge-containing nanosheet/nanowires and degrade the process window control of device performance of the GAA finFET devices. In addition, higher etch selectivity is desired for other high selective Si etching processes.

Various embodiments in the present disclosure provide methods for forming a semiconductor device by high selectivity etching with a germanium-containing (Ge-containing) gas. In some embodiments, the Ge-containing gas can include germanium hydride ($GeH_4$), germanium fluoride ($GeF_4$), germanium chloride ($GeCl_4$), and germanium hydrofluoride ($GeH_xF_y$). The example methods in the present disclosure can form a semiconductor device including a fin structure having a first set of semiconductor layers and a second set of semiconductor layers. The first set of semiconductor layers can include germanium and the second set of semiconductor layers can include silicon. A primary etchant and the Ge-containing gas can be delivered to the fin structure. In some embodiments, the primary etchant can include a hydrogen radical (H*), a fluorine radical (F*), a nitrogen fluoride radical ($NF_x$*), fluorine ($F_2$), hydrogen fluoride (HF), carbon fluoride ($CF_4$), chlorine ($Cl_2$), and hydrogen chloride (HCl). The primary etchant and the Ge-containing gas can etch a portion of the second set of semiconductor layers. In some embodiments, the Ge-containing gas can inhibit etching of the first set of semiconductor layers according to the Le Chatelier principle. In some embodiments, adding Ge-containing gas can increase surface adsorption of Ge-containing gas and Ge-containing byproducts on exposed surfaces of the first set of semiconductor layers, passivate the exposed surfaces, and prevent the etching of the first set of semiconductor layers. In some embodiments, some species of the Ge-containing gas can etch the second set of semiconductor layers and increase the etching rate of the second set of semiconductor layers. In some embodiments, the Ge-containing gas can increase the etch selectivity of Si to SiGe or Ge to a range from about 20 to about 100. The term "etch selectivity" can refer to the ratio of the etch rates of two different materials under the same etching conditions. In some embodiments, using high selectivity etching with the Ge-containing gas, the fin structure can have substantially no SiGe or Ge loss.

Figure 1A:
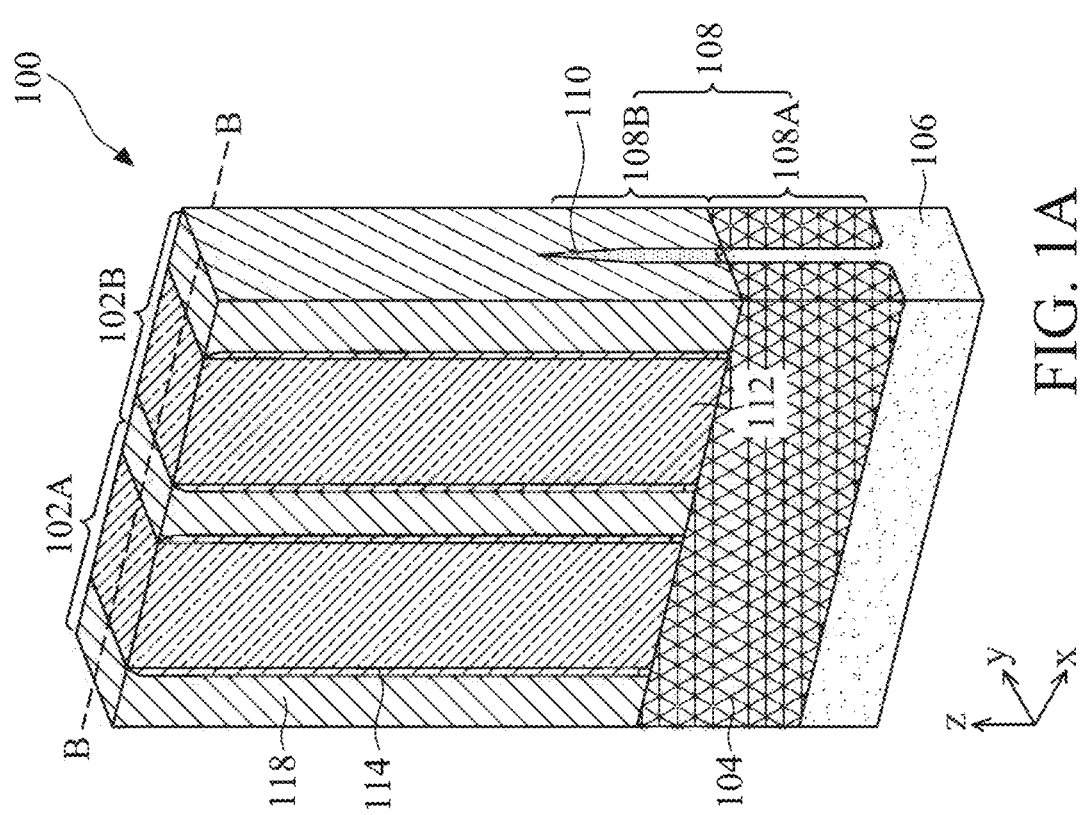
Figure 1D:
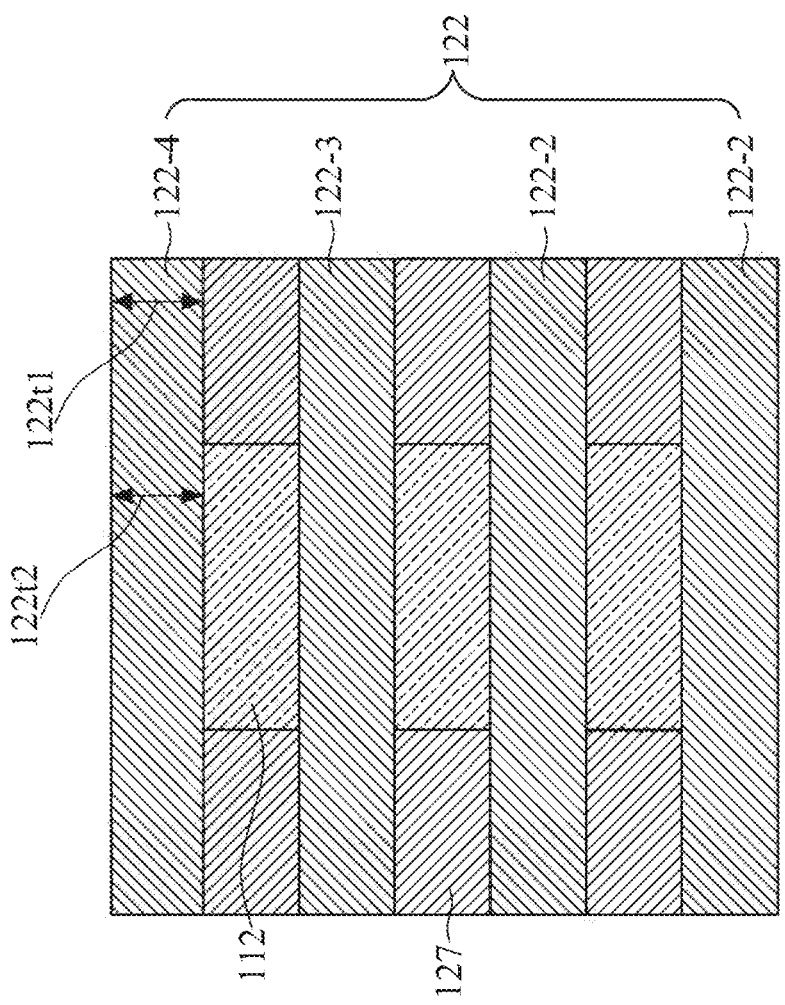
Figure 1C:
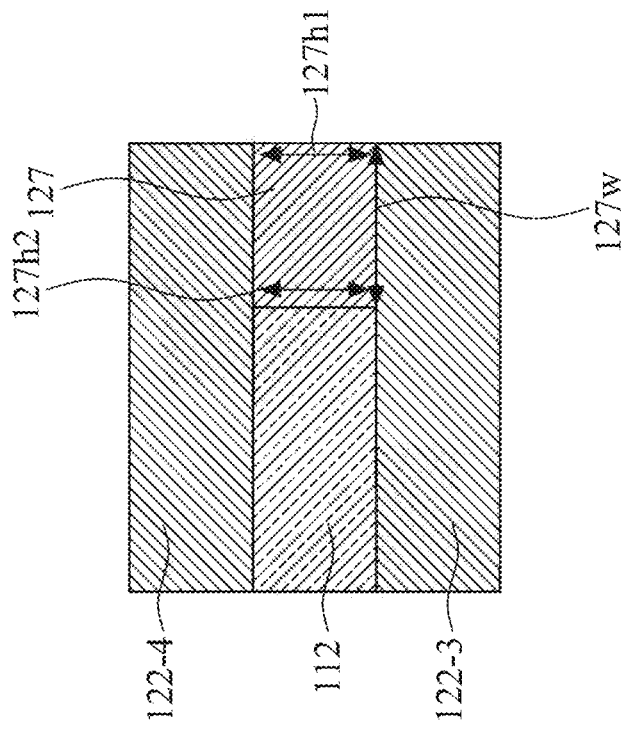

A semiconductor device 100 having finFETs 102A-102B is described with reference to FIGS. 1A-1D, according to some embodiments. FIG. 1A illustrates an isometric view of semiconductor device 100 formed by high selectivity etching with a germanium-containing gas, according to some embodiments. FIG. 1B illustrates a partial cross-sectional view along line B-B of semiconductor device 100 formed by high selectivity etching with a germanium-containing gas, according to some embodiments. FIG. 1C illustrates a zoomed-in area C of the partial cross-sectional view of FIG. 1B and FIG. 1D illustrates a zoomed-in area D of the partial cross-sectional view of FIG. 1B, according to some embodiments.

In some embodiments, finFETs 102A-102B can be both p-type finFETs (PFETs), both n-type finFETs (NFETS), or one of each conductivity type finFET. Though FIGS. 1A-1B show two GAA finFETs, semiconductor device 100 can have any number of GAA finFETs. In addition, semiconductor device 100 can be incorporated into an integrated circuit (IC) through the use of other structural components, such as contacts, conductive vias, conductive lines, dielectric layers, passivation layers, interconnects, etc., that are not shown for simplicity. The discussion of elements of finFETs 102A-102B with the same annotations applies to each other, unless mentioned otherwise.

Referring to FIGS. 1A and 1B, finFETs 102A-102B can be formed on a substrate 106. Substrate 106 can include a semiconductor material, such as silicon (Si). In some embodiments, substrate 106 can include a crystalline silicon substrate (e.g., wafer). In some embodiments, substrate 106 can include (i) an elementary semiconductor, such as germanium (Ge); (ii) a compound semiconductor, such as silicon carbide (SiC); (iii) an alloy semiconductor, such as silicon germanium (SiGe); (iv) a silicon-on-insulator (SOI) structure; (v) a silicon germanium (SiGe)-on insulator structure (SiGeOI); (vi) germanium-on-insulator (GeOI) structure; and (vii) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Referring to FIGS. 1A-1D, finFETs 102A-102B can further include STI regions 104, a fin structure 108, gate structures 112, and gate spacers 114. STI regions 104 can provide electrical isolation between finFET 102A and finFET 102B from each other and from neighboring finFETs with different fin structures (not shown) on substrate 106 and/or neighboring active and passive elements (not shown) integrated with or deposited on substrate 106. STI regions 104 can be made of a dielectric material. In some embodiments, STI regions 104 can include silicon oxide, silicon nitride, silicon oxynitride, fluorine-doped silicate glass (FSG), a low-k dielectric material, and/or other suitable insulating materials. In some embodiments, STI regions 104 can include a multi-layered structure.

Fin structure 108 can extend along an X-axis and through finFETs 102A-102B. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Fin structure 108 can include a fin bottom portion 108A and a fin top portion 108B disposed on fin bottom portion 108A. In some embodiments, fin bottom portion 108A can include material similar to substrate 106. Fin bottom portion 108A can be formed from a photolithographic patterning and an etching of substrate 106. In some embodiments, fin top portion 108B can include an epitaxial substrate layer 107, stacked fin portions $108B_1$ and $108B_2$, and epitaxial fin regions 110. Epitaxial substrate layer 107 can be formed on fin bottom portion 108A and can serve as a substrate for stacked fin portions $108B_1$ and $108B_2$. Each of stacked fin portions $108B_1$ and $108B_2$ can be formed on epitaxial substrate layer 107 and can include a stack of semiconductor layers 122-1, 122-2, 122-3, and 122-4 (collectively referred to as "semiconductor layers 122"), which can be in the form of nanosheets or nanowires. Each of semiconductor layers 122 can form a channel region underlying gate structures 112 of finFETs 102A-102B.

In some embodiments, epitaxial substrate layer 107 and semiconductor layers 122 can include semiconductor materials similar to or different from substrate 106. In some embodiments, each of epitaxial substrate layer 107 and semiconductor layers 122 can include silicon germanium (SiGe) having Ge concentration in a range from about 40 atomic percent to about 100 atomic percent. If the Ge concentration is lower than about 40 atomic percent, hole mobility in the channel region of finFETs 102A-102B may not be increased and the device performance may not be improved. The semiconductor materials of epitaxial substrate layer 107 and semiconductor layers 122 can be undoped or can be in-situ doped during their epitaxial growth process. Epitaxial substrate layer 107 can have a vertical dimension 107t (e.g., thickness) along a Z-axis ranging from about 20 nm to about 40 nm. If vertical dimension 107*t* is less than about 20 nm, stacked fin portions 108B$_1$ and 108B$_2$ may have more epitaxial growth defects. If vertical dimension 107*t* is greater than about 40 nm, the benefits of epitaxial substrate layer 107 may be diminished. Semiconductor layers 122 can have with a vertical dimension 122*t*1 (e.g., thicknesses) along a Z-axis at a first portion adjacent to inner spacer structures 127, ranging from about 5 nm to about 10 nm. Semiconductor layers 122 can have a vertical dimension 122*t*2 (e.g., thicknesses) along a Z-axis at a second portion adjacent to gate structures 112, ranging from about 1 nm to about 12 nm. A ratio of vertical dimensions 122*t*2 to 122*t*1 can range from about 10% to about 100%. If the ratio is less than about 10%, the dimension of the channel region may be reduced and the device performance may be degraded. In some embodiments, vertical dimension 122*t*2 can be the same as vertical dimension 122*t*1 and the ratio of 122*t*2 to 122*t*1 can reach about 100%. As a result, the channel region of finFETs 102A-102B can be increased and the process window control of the device performance can be improved. Other dimensions and materials for semiconductor layers 122 are within the scope and spirit of this disclosure. Though four layers of semiconductor layers 122 are shown in FIGS. 1A-1D, finFETs 102A-102B can have any number of semiconductor layers 122.

Referring to FIGS. 1A-1D, epitaxial fin regions 110 can be disposed between stacked fin portions 108B$_1$ and 108B$_2$, respectively. In some embodiments, epitaxial fin regions 110 can have any geometric shape, such as a polygon, an ellipsis, and a circle. Epitaxial fin regions 110 can include an epitaxially-grown semiconductor material. In some embodiments, the epitaxially grown semiconductor material includes a same material as or different material from substrate 106. In some embodiments, the epitaxially-grown semiconductor material for epitaxial fin regions 110 can be the same as or different from each other.

Referring to FIGS. 1A-1D, gate structures 112 can be multi-layered structures and can be wrapped around semiconductor layers 122 of stacked fin portions 108B$_1$ and 108B$_2$. In some embodiments, each of semiconductor layers 122 can be wrapped around by one of gate structures 112 or one or more layers of one of gate structures 112 respectively, for which gate structures 112 can be referred to as "gate-all-around (GAA) structures" and finFETs 102A and 102B can also be referred to as "GAA FETs 102A-102B" or "GAA finFETs 102A-102B."

Each of gate structures 112 can include a gate dielectric layer disposed on semiconductor layers 122 and a gate electrode disposed on the gate dielectric layer. The gate dielectric layer can be wrapped around each of semiconductor layers 122, and thus electrically isolate semiconductor layers 122 from each other and from the conductive gate electrode to prevent shorting between gate structures 112 and semiconductor layers 122 during operation of finFETs 102A-102B. In some embodiments, the gate dielectric layer can include an interfacial layer and a high-k layer. The term "high-k" can refer to a high dielectric constant. In the field of semiconductor device structures and manufacturing processes, high-k can refer to a dielectric constant that is greater than the dielectric constant of SiO$_2$ (e.g., greater than about 3.9). In some embodiments, the interfacial layer can include silicon oxide. In some embodiments, the high-k layer can include hafnium oxide (HfO$_2$), zirconium oxide (ZrO$_2$), and or suitable high-k dielectric materials.

In some embodiments, the gate electrode can include a gate barrier layer, a gate work function layer, and a gate metal fill layer. Each of semiconductor layers 122 can be wrapped around by one of gate barrier layers and one of gate work function layer. Depending on the space between adjacent semiconductor layers 122 and the thicknesses of the layers of gate structures 112, semiconductor layers 122 can be wrapped around by one or more layers of the gate electrode filling the spaces between adjacent semiconductor layers 122. Though gate structures 112 of finFETs 102A-102B are shown to be similar, finFETs 102A-102B can have gate structures with materials and/or electrical properties (e.g., threshold voltage and work function value) different from each other. Also, though gate structures 112 are shown to have horizontal GAA structures, other gate structures (e.g., vertical GAA structures) are within the scope and spirit of this disclosure.

Referring to FIGS. 1A-1B, gate spacers 114 can form on sidewalls of gate structures 112 and can be in physical contact with portions of the gate dielectric layer, according to some embodiments. Gate spacers 114 can include insulating material, such as silicon oxide, silicon nitride, a low-k material, and a combination thereof. Gate spacers 114 can include a single layer or a stack of insulating layers. Gate spacers 114 can have a low-k material with a dielectric constant less than about 3.9 (e.g., about 3.5, about 3.0, or about 2.8).

Referring to FIGS. 1A-1B, semiconductor device 100 can further include an interlayer dielectric (ILD) layer 118 and a protective oxide layer 134. ILD layer 118 can be disposed on epitaxial fin regions 110 and STI regions 104. ILD layer 118 can include a dielectric material deposited using a deposition method suitable for flowable dielectric materials. For example, flowable silicon oxide can be deposited using flowable CVD (FCVD). In some embodiments, the dielectric material can be silicon oxide. Protective oxide layer 134 can be disposed on fin structure 108 and STI regions 104. Protective oxide layer 134 can include a suitable oxide material, such as silicon oxide. In some embodiments, protective oxide layer 134 can protect fin structure 108 during the fabrication processes.

Referring to FIGS. 1A-1D, semiconductor device 100 can further include inner spacer structures 127. Inner spacer structures 127 can be disposed between semiconductor layers 122 and adjacent to epitaxial fin regions 110 and gate structures 112. Inner spacer structures 127 can include a dielectric material, such as silicon oxynitride (SiON), silicon carbonitride (SiCN), silicon oxycarbide (SiOC), silicon oxycarbonitride (SiOCN), silicon nitride (SiN$_x$), silicon oxide (SiO$_x$), and a combination thereof. In some embodiments, inner spacer structures 127 can include a single layer or multiple layers of insulating materials.

In some embodiments, inner spacer structures 127 can isolate gate structures 112 and epitaxial fin regions 110. In some embodiments, inner spacer structures 127 can have a vertical dimension 127*h*1 (e.g., height) along a Z-axis at a first end portion adjacent to epitaxial fin regions 110 and an end portion of semiconductor layers 122. In some embodiments, inner spacer structures 127 can have a vertical dimension 127*h*2 (e.g., height) at a second end portion adjacent to gate structures 112. The second end portion is opposite to the first end portion. Vertical dimensions 127*h*1 and 127*h*2 can range from about 5 nm to about 12 nm. A difference between vertical dimensions 127*h*1 and 127*h*2 can be less than about 3 nm. In some embodiments, inner spacer structures 127 can have a horizontal dimension 127*w* (e.g., width) along an X-axis between the first end portion and the second end portion. Horizontal dimension 127*w* can range from about 5 nm to about 10 nm. A ratio of the difference between vertical dimensions 127*h*1 and 127*h*2 to horizontal dimension 127*w* can be less about 0.3. If the difference between vertical dimensions 127h1 and 127h2 is greater than about 3 nm, or the ratio of the difference to horizontal dimension 127w is greater than about 0.3, vertical dimension 122t of semiconductor layers 122 can be reduced and the channel region of finFETs 102A-102B can be reduced. As a result, the device performance of finFETs 102A-102B can be degraded.

Figure 2:
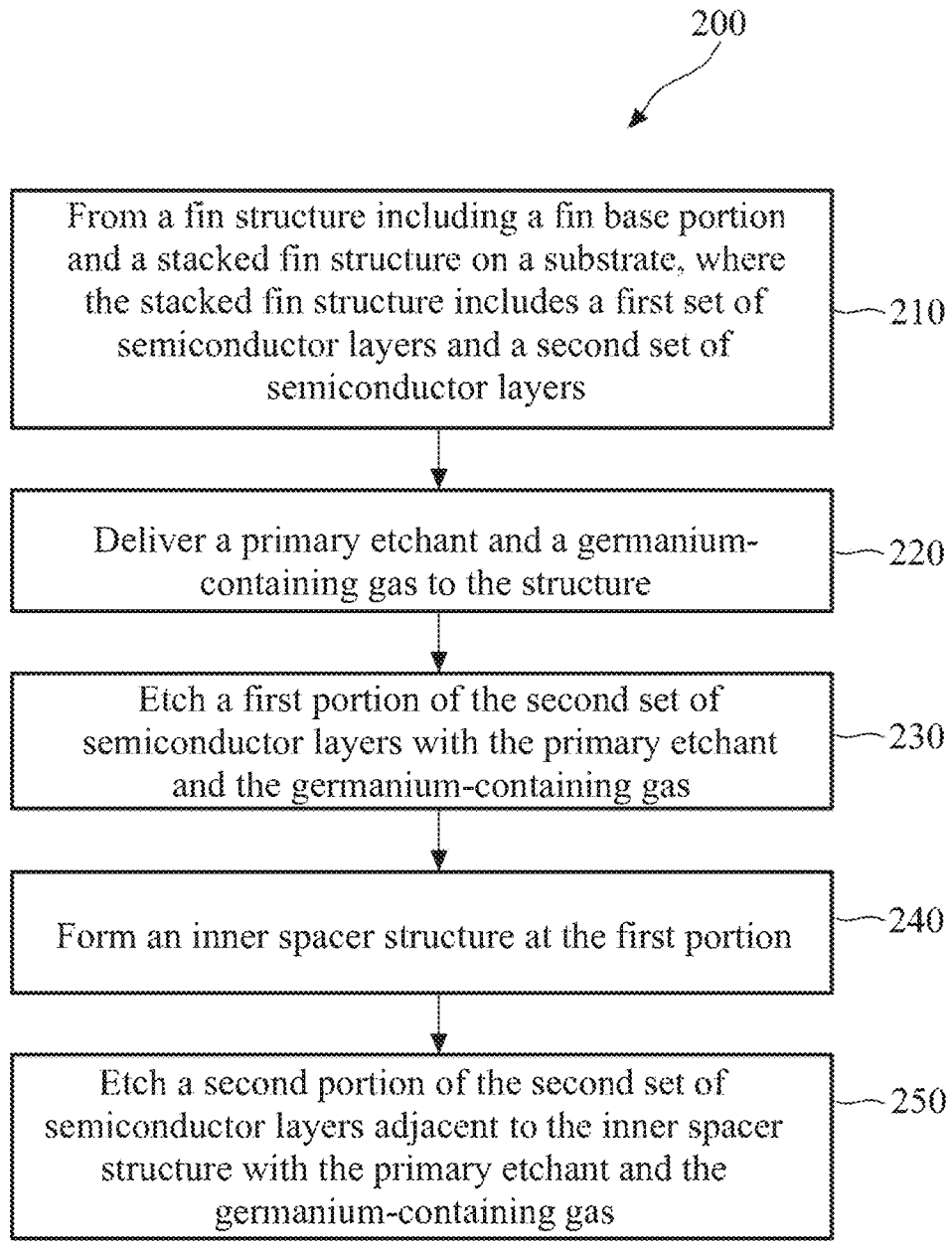
FIG. 2 is a flow diagram of a method for fabricating a semiconductor device by high selectivity etching with a germanium-containing gas, in accordance with some embodiments.

FIG. 2 is a flow diagram of a method 200 for fabricating semiconductor device 100 device by high selectivity etching with a germanium-containing gas, in accordance with some embodiments. Method 200 may not be limited to finFET devices and can be applicable to devices that would benefit from high selectivity Si etching with a germanium-containing gas, such as planar FETs, finFETs, GAA FETs, etc. Additional fabrication operations may be performed between various operations of method 200 and may be omitted merely for clarity and ease of description. Additional processes can be provided before, during, and/or after method 200; one or more of these additional processes are briefly described herein. Moreover, not all operations may be needed to perform the disclosure provided herein. Additionally, some of the operations may be performed simultaneously or in a different order than shown in FIG. 2. In some embodiments, one or more other operations may be performed in addition to or in place of the presently described operations.

For illustrative purposes, the operations illustrated in FIG. 2 will be described with reference to the example fabrication process for fabricating semiconductor device 100 as illustrated in FIGS. 3-8D. FIGS. 3-8D are partial cross-sectional views of semiconductor device 100 along line B-B of FIG. 1A at various stages of its fabrication, according to some embodiments. Although FIGS. 3-8D illustrate fabrication processes of semiconductor device 100 device formed by high selectivity etching with a germanium-containing gas, method 200 can be applied to other high selectivity Si etching processes. Elements in FIGS. 3-8D with the same annotations as elements in FIGS. 1A-1D are described above.

Figures 3, 4A:
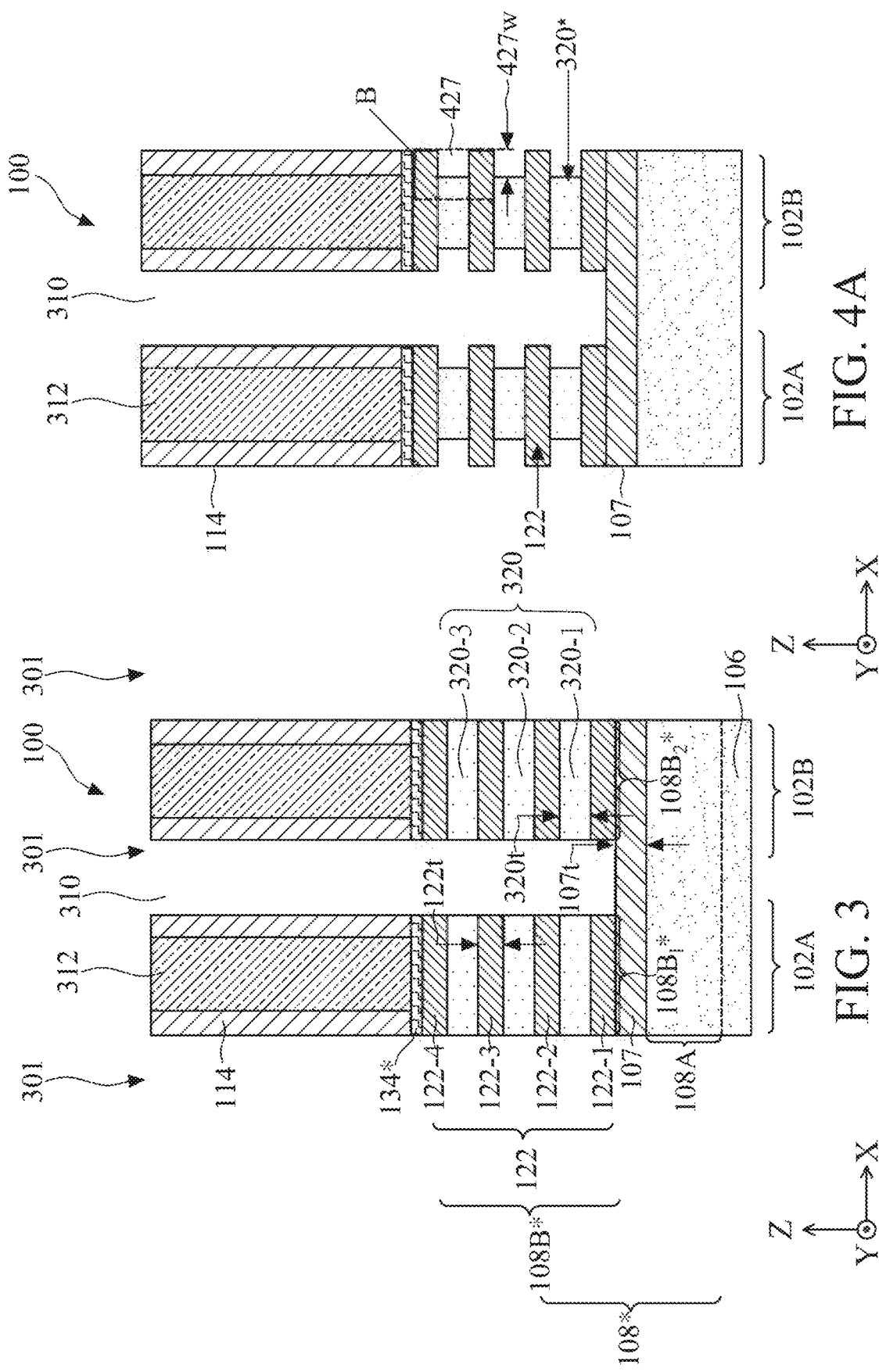

In referring to FIG. 2, method 200 begins with operation 210 and the process of forming a fin structure including a fin bottom portion and a stacked fin portion on a substrate. The stacked fin portion includes an epitaxial substrate layer on the fin bottom portion, a first set of semiconductor layers, and a second set of semiconductor layers. The first and second set of semiconductor layers are stacked in an alternating configuration. For example, as shown in FIG. 3, fin structure 108* with fin bottom portion 108A and fin top portion 108B* can be formed on substrate 106. Protective oxide layer 134* can be formed on fin structures 108*. Polysilicon structures 312 can be formed on protective oxide layer 134*. Gate spacers 114 can be formed on sidewalls of polysilicon structures 312. Fin top portion 108B* can include epitaxial substrate layer 107 and stacked fin portions 108B$_1$* and 108B$_2$*. Stacked fin portions 108B$_1$* and 108B$_2$* can include a first set of semiconductor layers 122-1, 122-2, 122-3, and 122-4 (collectively referred to as "semiconductor layers 122") and a second set of semiconductor layers 320-1, 320-2, and 320-3 (collectively referred to as "semiconductor layers 320").

Epitaxial substrate layer 107 and each semiconductor layer in stacked fin portions 108B$_1$* and 108B$_2$* can be epitaxially grown on its underlying layer followed by a vertical etch to form an opening 310. In some embodiments, S/D regions can be formed in opening 310 in subsequent processes. In some embodiments, the vertical etch of semiconductor layers 122 and 320 can include a biased etching process. In some embodiments, the biased etching process can be directional and semiconductor layers 122 and 320 can have substantially no lateral etch. In some embodiments, the biased etching process can be controlled by time and an over etch can form a dip in epitaxial substrate layer 107. In some embodiments, epitaxial substrate layer 107 can have a vertical dimension 107t (e.g., thickness) along a Z-axis ranging from about 20 nm to about 40 nm. If vertical dimension 107t is less than about 20 nm, stacked fin portions 108B$_1$* and 108B$_2$* may have more epitaxial growth defects. If vertical dimension 107t is greater than about 40 nm, the benefits of epitaxial substrate layer 107 may saturate.

Semiconductor layers of stacked fin portions 108B$_1$* and 108B$_2$* can include semiconductor materials different from each other. In some embodiments, semiconductor layers 122 and 320 can include semiconductor materials similar to or different from substrate 106. In some embodiments, semiconductor layers 122 and 320 can include semiconductor materials with oxidation rates and/or etch selectivity different from each other. In some embodiments, semiconductor layers 122 can include silicon germanium (SiGe) with Ge in a range from about 40 atomic percent to about 100 atomic percent with any remaining atomic percent being Si. If the Ge is less than about 40 atomic percent, the etch selectivity between semiconductor layers 122 and 320 may be low and semiconductor layers 122 may have SiGe loss problems during etching of semiconductor layers 320. In some embodiments, semiconductor layers 320 can include Si without any substantial amount of Ge. Semiconductor layers 122 can have a vertical dimension 122t (e.g., thickness) along a Z-axis ranging from about 5 nm to about 10 nm. Semiconductor layers 320 can have a vertical dimension 320t (e.g., thickness) along a Z-axis ranging from about 5 nm to about 12 nm. Vertical dimensions 122t and 320t can be equal to or different from each other. Though four semiconductor layers 122 and three semiconductor layers 320 for stacked fin portions 108B$_1$* and 108B$_2$* are shown in FIG. 3, semiconductor device 100 can have any number of semiconductor layers 122 and 320.

Referring to FIG. 2, in operation 220, a primary etchant and a Ge-containing gas are delivered to the fin structure to remove semiconductor layers 320. For example, as shown by arrows 301 in FIG. 3, the primary etchant and the Ge-containing gas can be delivered to fin structure 108* through opening 310. In some embodiments, the primary etchant can include a hydrogen radical (H*), a fluorine radical (F*), a nitrogen fluoride radical (NF$_x$*), fluorine (F$_2$), hydrogen fluoride (HF), carbon fluoride (CF$_4$), chlorine (Cl$_2$), and hydrogen chloride (HCl). In some embodiments, the Ge-containing gas can include germanium hydride (GeH$_4$), germanium fluoride (GeF$_4$), germanium chloride (GeCl$_4$), and germanium hydrofluoride (GeH$_x$F$_y$). In some embodiments, a first flow rate of the primary etchant can range from about 1 sccm to about 3000 sccm. In some embodiments, a second flow rate of the Ge-containing gas can range from about 0.1 sccm to about 3000 sccm. A ratio of the second flow rate to the first flow rate can range from about 0.1 to about 100. If the second flow rate is less than about 0.1 sccm, or the ratio is less than about 0.1, the etch selectivity of semiconductor layers 320 to semiconductor layers 122 may not be improved. If the second flow rate is greater than about 3000 sccm, or the ratio is greater than about 100, the etching rate may be reduced by lower concentration of the primary etchant.

Referring to FIG. 2, in operation 230, the primary etchant and the Ge-containing gas etch a first portion of the second set of semiconductor layers. For example, as shown in FIGS. 4A-4F, the primary etchant and the Ge-containing gas can etch an end portion of semiconductor layers 320 and form openings 427. In some embodiments, the etching process can be performed at a temperature ranging from −20° C. to about 150° C. under a pressure ranging from about 100 mTorr to about 10 Torr. In some embodiments, the Ge-containing gas can inhibit etching of semiconductor layers 122 according to the Le Chatelier principle. The Le Chatelier principle states that if a dynamic equilibrium is disturbed by changing the conditions, the position of equilibrium moves to counteract the change. Etching of Si and SiGe can form Si-containing byproducts and Ge-containing byproducts through the following reaction:

Si+SiGe+etchant↔Si-containing byproducts+Ge-containing by-products.

According to the Le Chatelier principle, addition of Ge-containing gas and increase of Ge-containing gas concentration can move the equilibrium of the above reaction to the left and inhibit etching of SiGe. For example, adding a fluorine radical as the primary etchant and germanium fluoride as the Ge-containing gas, etching of semiconductor layers 122 can be inhibited through the following reaction:

Si+SiGe(loss less)+F*+GeF$_4$↔SiF$_4$(more)+GeF$_4$ (formation inhibited).

In addition, the addition of Ge-containing gas during the etching process can form a Ge-containing gas rich ambient, which can increase surface adsorption of Ge-containing gas and Ge-containing byproducts on semiconductor layers 122 and form a passivation layer to prevent the primary etchants to react with semiconductor layers 122. As shown in FIGS. 4B and 4C, a passivation layer 436 can be formed by the Ge-containing gas and the Ge-containing byproducts on exposed surfaces of semiconductor layers 122 during the etching process. In some embodiments, passivation layer 436 can have a thickness 436t ranging from about 0.1 nm to about 1.5 nm. If thickness 436t is less than about 0.1 nm, semiconductor layers 122 may have more SiGe or Ge loss. If thickness 436t is greater than about 1.5 nm, Si etching rate may be reduced.

Furthermore, some species of Ge-containing gases, such as GeH$_4$ and GeF$_4$, can etch silicon, which can further improve etching of Si while passivating exposed surfaces of SiGe or Ge. For example, adding GeH$_4$ and GeF$_4$ can assist etching Si with no additional loss of SiGe and low-k spacer layers (e.g., gate spacers 114 and inner spacer structures 127). SiGe and low-k spacer layers can have a higher reaction energy (Ea) and may not react with GeH$_4$ and GeF$_4$. For example, the reaction energy can be higher than about 1.5 eV. In some embodiments, GeH$_4$ or GeF$_4$, can etch Si through following reactions:

Si+GeF$_4$(GeH$_4$)→SiF$_2$(SiH$_2$)+GeF$_2$·(GeH$_2$)

SiGe+GeF$_4$(GeH$_4$)→no reaction(high Ea).

SiO$_2$(SiN)+GeF$_4$(GeH$_4$)→no reaction(high Ea).

In some embodiments, during the etching process, the primary etchant can have a first etching rate on semiconductor layers 320 ranging from about 1 nm/min to about 500 nm/min. The Ge-containing gas can have a second etching rate on semiconductor layers 320 ranging from about 1 nm/min to about 250 nm/min. In some embodiments, a ratio of the first etching rate to the second etching rate can range from about 1 to about 500. If the second etching rate is less than about 1 nm/min, or the ratio is greater than about 500, the addition of the Ge-containing gas may not be high enough to assist Si etching and etch selectivity may not be improved. If the second etching rate is greater than about 250 nm/min or the ratio is less than about 1, the Ge-containing gas may have a higher concentration and the primary etchant may have a lower concentration, which can reduce the Si etching rate.

With the addition of the Ge-containing gas with the primary etchant, etching of SiGe and Ge can be inhibited, the addition of the Ge-containing gas can increase surface adsorption of Ge-containing gas and Ge-containing byproducts and form a passivation layer to prevent etchants from etching SiGe and Ge, and some species of the Ge-containing gas can etch Si and further improve etching of Si. As a result, etch selectivity between Si and SiGe or Ge can be increased. In some embodiments, the etch selectivity between semiconductor layers 320 and 122 can range from about 20 to about 100. If the etch selectivity is less than about 20, semiconductor layers 122 may have SiGe or Ge loss and the dimensions of the channel regions can be reduced. If the etch selectivity is higher than about 100, the Si etching rate can be reduced.

Increasing etch selectivity with the addition of the Ge-containing gas can improve the etching profile. For example, as shown in FIG. 4D without addition of Ge-containing gas, semiconductor layers 122 can be etched during etching of semiconductor layers 320. "V" shape openings 427* can be formed after the etching process. In some embodiments, openings 427* can have a vertical dimension 427h1* (e.g., height) along a Z-axis adjacent to the end of semiconductor layers 122 ranging from about 8 nm to about 20 nm. Openings 427* can have another vertical dimension 427h2* (e.g., height) along a Z-axis adjacent to semiconductor layers 320* ranging from about 5 nm to about 12 nm. Openings 427* can have a horizontal dimension 427w* (e.g., width) along an X-axis ranging from about 5 nm to about 10 nm. A difference between vertical dimensions 427h1* and 427h2* can range from about 3 nm to about 15 nm. A ratio of the difference to horizontal dimension 427w* can range from about 0.3 to about 3. According to some embodiments, FIG. 4F illustrates actual etching profiles of semiconductor layers 122 during etching of semiconductor layer 320 without the addition of a Ge-containing gas. As shown in FIG. 4F, the etching profiles can have rounded corners at the end of semiconductor layers 122 and between semiconductor layers 122 and 320*. In addition, openings 427* can have a vertical dimension along a Z-axis adjacent to the end of semiconductor layers 122 larger than adjacent to a vertical dimension adjacent to semiconductor layers 320*, similar to FIG. 4D.

Figure 4E:
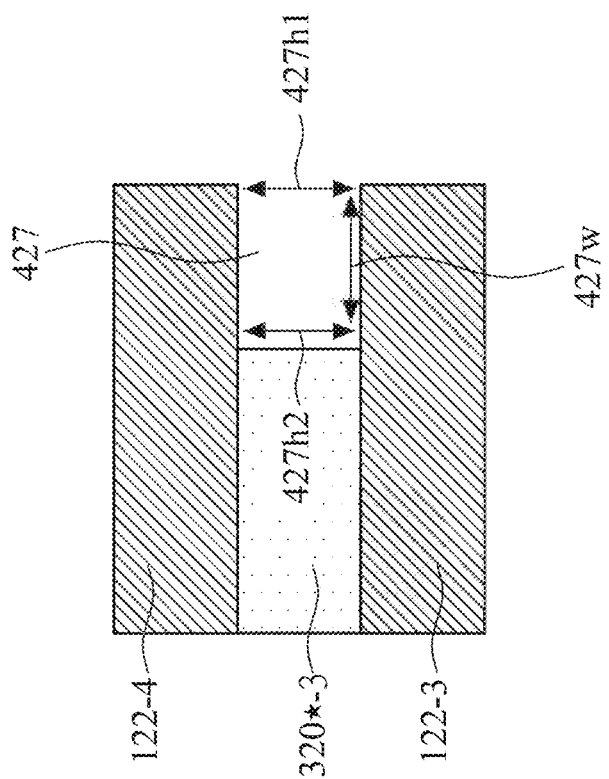
Figure 4D:
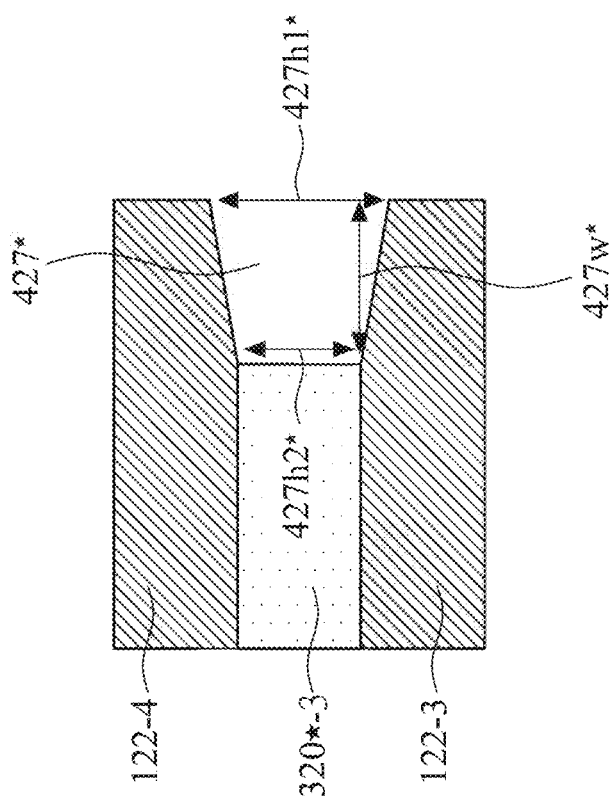
Figure 4F:
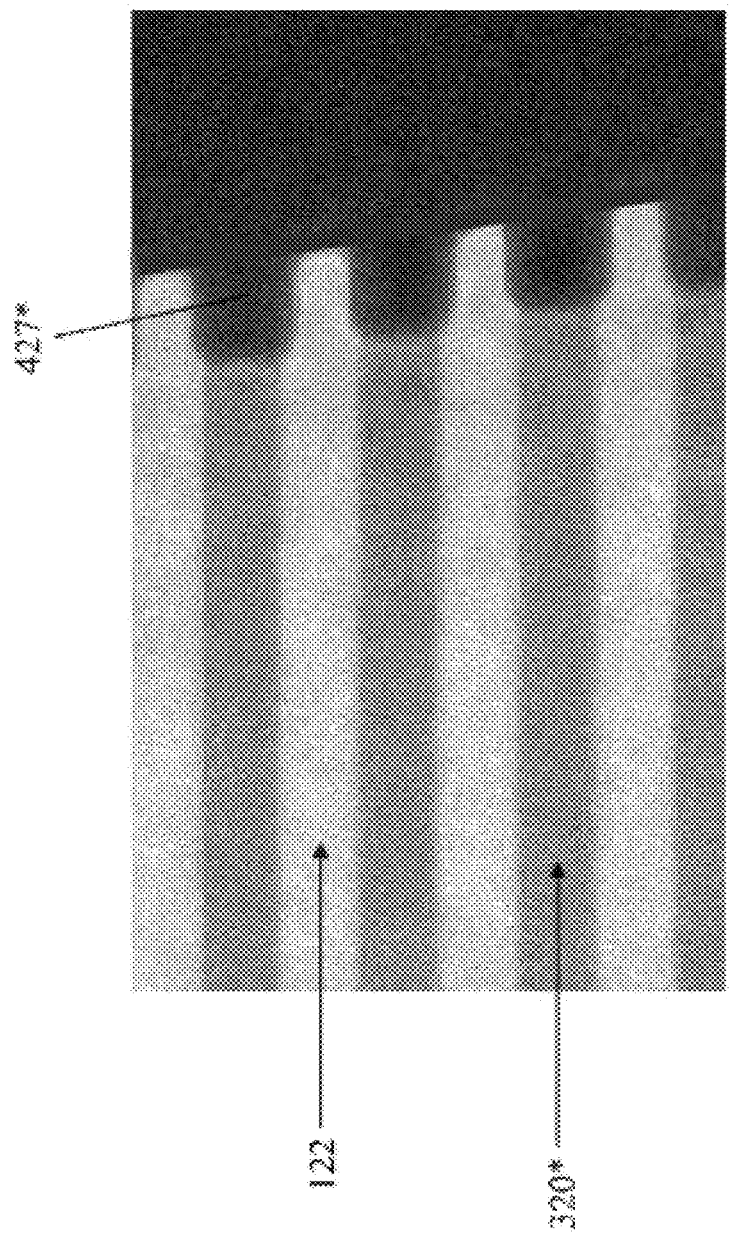
Figure 7:
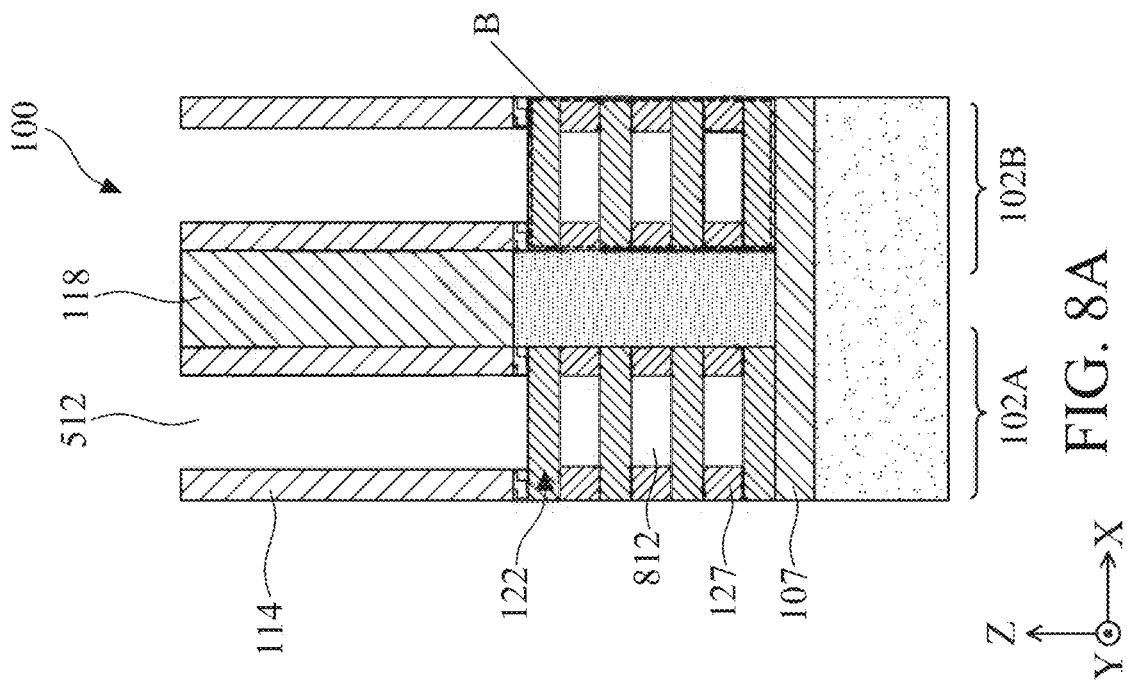

In some embodiments, "U" shape openings 427 as shown in FIG. 4E can be formed after the etching process with the addition of the Ge-containing gas. Openings 427 can have a vertical dimension 427h1 (e.g., height) along a Z-axis adjacent to the end of semiconductor layers 122 ranging from about 5 nm to about 12 nm. Openings 427 can have another vertical dimension 427h2 (e.g., height) along a Z-axis adjacent to semiconductor layers 320* ranging from about 5 nm to about 12 nm. Openings 427 can have a horizontal dimension 427w (e.g., width) along an X-axis ranging from about 5 nm to about 10 nm. A difference between vertical dimensions 427h1 and 427h2 can range from about 0 to about 3 nm. A ratio of the difference to horizontal dimension 427w can range from about 0 to about 0.3. If the difference is greater than about 3 nm, or the ratio is greater than about 0.3, semiconductor layers 122 can have SiGe or Ge loss and the dimensions of the channel region of finFETs 102A-102B can be reduced, which can degrade the process window control and the device performance of finFETs 102A-102B. Comparing FIG. 4E with FIG. 4D, the etching profile of finFETs 102A-102B can be improved with increased etch selectivity by adding the Ge-containing gas.

Referring to FIG. 2, in operation 240, an inner spacer structure can be formed at the first portion of the second set of semiconductor layers. For example, as shown in FIG. 5, inner spacer structures 127 can be formed at openings 427, where end portions of semiconductor layers 320 are removed. The formation of inner spacer structures 127 can include a blanket deposition of an inner spacer layer and a lateral etch of the blanket deposited inner spacer layer. In some embodiments, the inner spacer layer can include a single layer or a stack of dielectric layers, deposited by atomic layer deposition (ALD), chemical vapor deposition (CVD), or other suitable methods. In some embodiments, the inner spacer layer can include a dielectric material, such as SiON, SiCn, SiOC, SiOCN, $SiN_x$, $SiO_x$, and a combination thereof. The blanket deposition can fill openings 427 with the dielectric material and cover exposed surfaces of finFETs 102A-102B. The lateral etch of the inner spacer layer can be performed by a dry etch process using a gas mixture of HF and ammonia ($NH_3$). After the lateral etch process, inner spacer structures 127 can be formed between semiconductor layers 122 and adjacent to semiconductor layers 320*. Inner spacer structures 127 can have horizontal dimension 127$w$ and vertical dimensions 127$h1$ and 127$h2$ as described above in FIG. 1C.

The formation of inner spacer structures 127 can be followed by formation of epitaxial fin regions 110 and ILD layer 118, as shown in FIG. 6. In some embodiments, epitaxial fin regions 110 can epitaxially grow on exposed surfaces of semiconductor layers 122 and epitaxial substrate layer 107 in opening 310. In some embodiments, epitaxial fin regions 110 can include multiple epitaxial fin sub-regions. A flowable dielectric material can be deposited in opening 310 followed by a chemical mechanical polishing (CMP) process to form ILD layer 118.

Figure 8A:
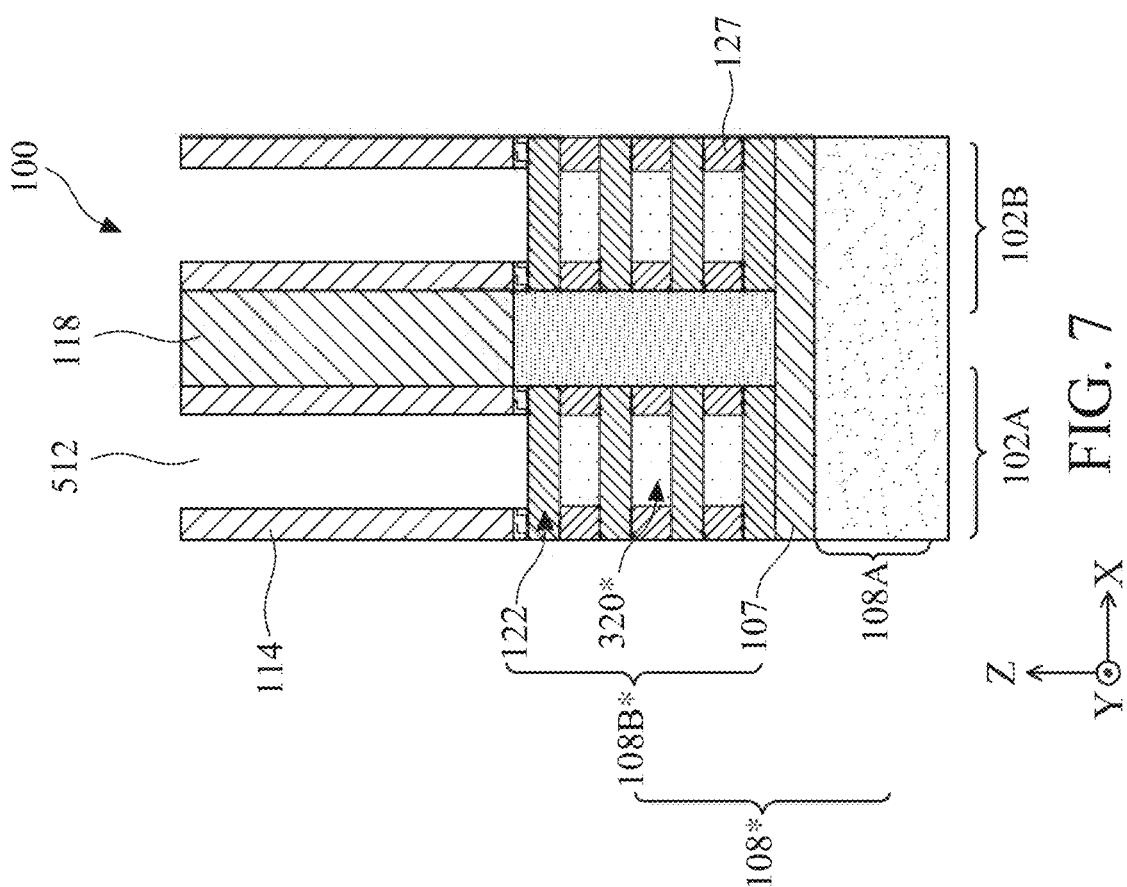
Figure 8C:
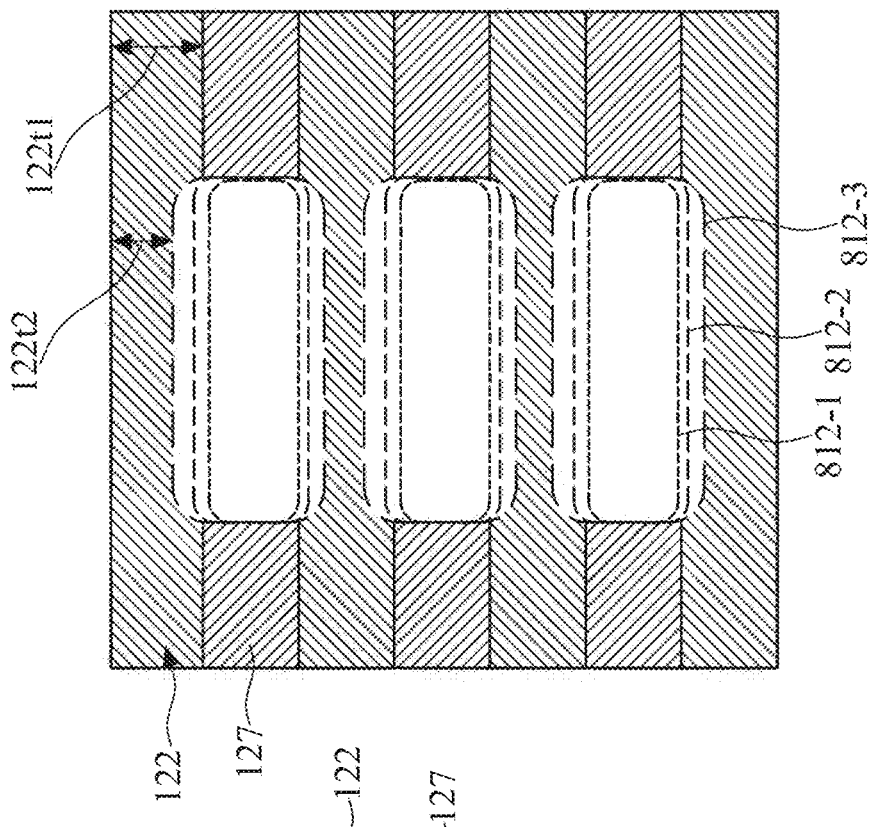
Figure 8B:
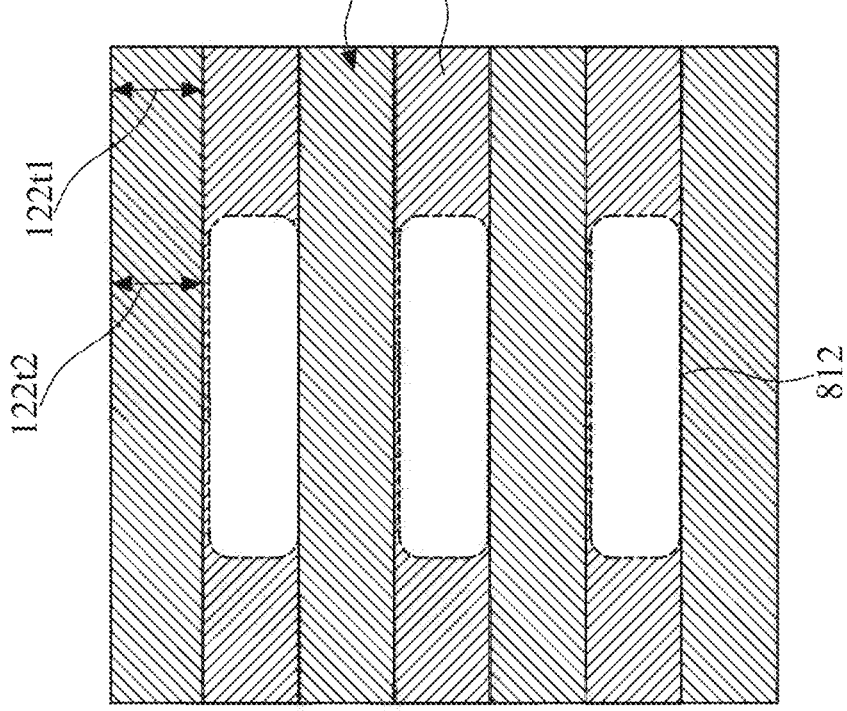

Referring to FIG. 2, in operation 250, the primary etchant and the Ge-containing gas etch a second portion of the second set of semiconductor layers adjacent to the inner spacer structure. For example, as shown in FIGS. 7 and 8A-8D, the remaining portions of semiconductor layers 320* can be etched and form openings 812 between semiconductor layers 122. FIG. 8B illustrates an enlarged view of area B in FIG. 8A, according to some embodiments. Prior to the etching of semiconductor layers 320*, polysilicon structures 312 can be removed to form openings 512. In some embodiments, polysilicon structures 312 can be removed by a dry etching process, a wet etching process, or a combination thereof. In some embodiments, portions of protective oxide layer 134* under polysilicon structures 312 can be removed during the removal of polysilicon structures 312.

In some embodiments, the remaining portions of semiconductor layers 320* can be removed by the same high selectivity etching process described in operations 220 and 230 with respect to FIGS. 4A-4F. The primary etchant and the Ge-containing gas can be delivered to fin structure 108* through openings 512. With the addition of the Ge-containing gas, etching of SiGe and Ge by the primary etchant can be inhibited, the added Ge-containing gas can increase surface adsorption of Ge-containing gas and Ge-containing byproducts and form a passivation layer to prevent etchants from etching SiGe and Ge, and some species of the Ge-containing gas can etch Si and further improve etching of Si. As a result, the etch selectivity between semiconductor layers 320 and 122 can reach about 20 to about 100.

In some embodiments, with control of the species of the Ge-containing gas and the flow rate of the Ge-containing gas, the etch selectivity between semiconductor layers 320 and 122 can be tuned to form "bone" shape nanosheets with semiconductor layers 122. For example, as shown in FIG. 8C, openings 812-1, 812-2, and 812-3 having different vertical dimensions can be formed between semiconductor layers 122 and vertical dimension 122$t2$ can vary with the etch selectivity. In some embodiments, the Ge-containing gas can include species that can etch Si, such as $GeH_4$ and $GeF_4$, to increase etch selectivity. In some embodiments, the flow rate of the Ge-containing gas can be increased to increase etch selectivity. In some embodiments, the etch selectivity can be further tuned by the temperature, the pressure, and the etching time of the etching process. For example, a lower temperature, a higher pressure, and a shorter etching with multiple cycles can increase etch selectivity of the etching process.

Figure 8D:
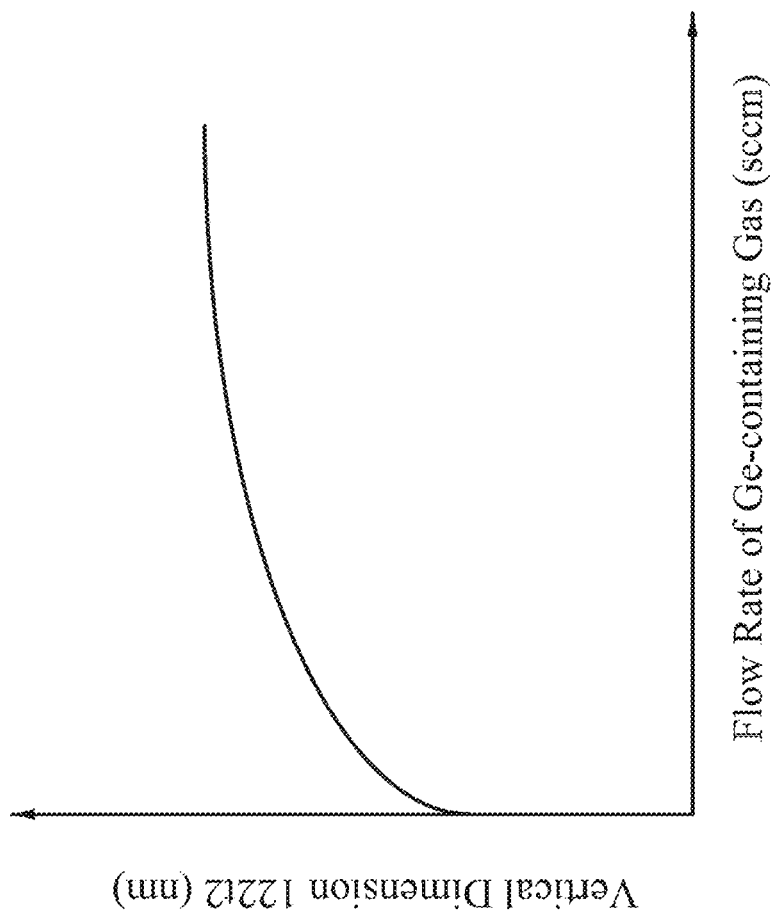

In some embodiments, with higher etch selectivity ranging from about 50 to about 100, semiconductor layers 122 can have essentially no SiGe or Ge loss, opening 812-1 can be formed as shown in FIG. 8C, and vertical dimension 122$t2$ can range from about 5 nm to about 10 nm. In some embodiments, with etch selectivity ranging from about 35 to about 50, semiconductor layers 122 can have some SiGe or Ge loss, opening 812-2 can be formed as shown in FIG. 8C, and vertical dimension 122$t2$ can range from about 3 nm to about 8 nm. In some embodiments, with etch selectivity ranging from about 20 to about 35, semiconductor layers 122 can have more SiGe or Ge loss, opening 812-3 can be formed as shown in FIG. 8C, and vertical dimension 122$t2$ can range from about 1 nm to about 6 nm. In some embodiments, the etch selectivity can be tuned by a flow rate of the Ge-containing gas. As a result, vertical dimension 122$t2$ can increase with the flow rate of the Ge-containing gas, as shown in FIG. 8D. By varying vertical dimension 122$t2$, the channel region can have different thicknesses, which can tune the channel resistance of finFETs 102A-102B. Similarly, by varying the vertical dimensions of openings 812-1, 812-2, and 812-3, gate work function layers with different thicknesses can form in openings 812-1, 812-2, and 812-3, which can tune the threshold voltages of finFETs 102A-102B.

The etching of the second portion of the second set of semiconductor layers by the primary etchant and the Ge-containing gas can be followed by the formation of gate structures 112, as shown in FIGS. 1A-1D. The formation of gate structures 112 can include formation of a gate dielectric layer and formation of a gate electrode. The formation of the gate dielectric layer can include deposition of an interfacial layer and deposition of a high-k layer. In some embodiments, the interfacial can include silicon oxide and can be deposited by ALD, CVD, or other suitable methods. In some embodiments, the interfacial can include silicon oxide and can be formed during a chemical clean process. The formation of the gate electrode can include deposition of a gate barrier layer, deposition of gate work function layer, and a metal fill. FIGS. 1A-1D illustrates semiconductor device 100 with finFETs 102A-102B after the formation of gate structures 112.

Various embodiments in the present disclosure provide methods for forming semiconductor device 100 by high selectivity etching with a germanium-containing (Ge-containing) gas. In some embodiments, the Ge-containing gas can include germanium hydride ($GeH_4$), germanium fluoride (GeF$_4$), germanium chloride (GeCl$_4$), and germanium hydrofluoride (GeH$_x$F$_y$). The example methods in the present disclosure can form semiconductor device 100 including fin structure 108 having semiconductor layers 122 and semiconductor layers 320. Semiconductor layers 122 can include germanium and semiconductor layers 320 can include silicon. A primary etchant and the Ge-containing gas can be delivered to fin structure 108. In some embodiments, the primary etchant can include a hydrogen radical (H*), a fluorine radical (F*), a nitrogen fluoride radical (NF$_x$*), fluorine (F$_2$), hydrogen fluoride (H F), carbon fluoride (CF$_4$), chlorine (Cl$_2$), and hydrogen chloride (HCl). The primary etchant and the Ge-containing gas can etch a portion of semiconductor layers 320. In some embodiments, the Ge-containing gas can inhibit etching of semiconductor layers 122 according to the Le Chatelier principle. In some embodiments, adding Ge-containing gas can increase surface adsorption of Ge-containing gas and Ge-containing byproducts on exposed surfaces of semiconductor layers 122, passivate the exposed surfaces, and prevent the etching of semiconductor layers 122. In some embodiments, some species of the Ge-containing gas can etch semiconductor layers 320 and increase the etching rate of semiconductor layers 320. In some embodiments, the Ge-containing gas can increase the etch selectivity of Si to SiGe or Ge to a range from about 20 to about 100. In some embodiments, using high selectivity etching with the Ge-containing gas, fin structure 108 can have substantially no SiGe or Ge loss.

In some embodiments, a method includes forming a fin structure including a fin bottom portion and a stacked fin portion on a substrate. The stacked fin portion includes a first semiconductor layer and a second semiconductor layer and the first semiconductor layer includes germanium. The method further includes etching the fin structure to form an opening, delivering a primary etchant and a germanium-containing gas to the fin structure through the opening, and etching a portion of the second semiconductor layer in the opening with the primary etchant and the germanium-containing gas.

In some embodiments, a method includes forming a fin structure including a fin bottom portion and a stacked fin portion on a substrate. The stacked fin portion includes a first set of semiconductor layers including germanium and a second set of semiconductor layers. The method further includes etching the fin structure to form an opening, delivering a primary etchant and a germanium-containing gas to the fin structure through the opening, etching a first portion of the second set of semiconductor layers in the opening with the primary etchant and the germanium-containing gas, forming an inner spacer structure at the first portion, and etching a second portion of the second set of semiconductor layers adjacent to the inner spacer structure with the primary etchant and the germanium-containing gas.

In some embodiments, a semiconductor device includes a fin structure including a fin bottom portion and a stacked fin portion on a substrate. The stacked fin portion multiple semiconductor layers and each of the multiple semiconductor layers includes germanium. The semiconductor device further includes a gate structure wrapped around a portion of the multiple semiconductor layers and an inner spacer structure adjacent to the gate structure and between the multiple semiconductor layers. The inner spacer structure includes a first end portion having a first height adjacent to an end of the multiple semiconductor layers, second end portion having a second height adjacent to the gate structure, and a width between the first end portion and the second end portion. The second end portion is opposite to the first end portion. A ratio of a difference between the first height and the second height to the width is less than about 0.3.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure including a fin bottom portion and a stacked fin portion on a substrate, wherein the stacked fin portion comprises a first semiconductor layer and a second semiconductor layer and the first semiconductor layer comprises germanium;
    etching the fin structure to form an opening;
    delivering a primary etchant and a germanium-containing gas to the fin structure through the opening; and
    etching a portion of the second semiconductor layer in the opening with the primary etchant and the germanium-containing gas.

2. The method of claim 1, wherein forming the fin structure comprises forming the first semiconductor layer with silicon.

3. The method of claim 1, wherein forming the fin structure comprises forming the second semiconductor layer with silicon germanium having germanium in a range from about 40 atomic percent to about 100 atomic percent.

4. The method of claim 1, wherein delivering the primary etchant and the germanium-containing gas comprises delivering the germanium-containing gas to the fin structure at a flow rate ranging from about 0.1 to about 3000 sccm.

5. The method of claim 1, wherein delivering the primary etchant and the germanium-containing gas comprises:
    delivering the primary etchant at a first flow rate; and
    delivering the germanium-containing gas at a second flow rate, a ratio of the second flow rate to the first flow rate ranges from about 0.1 to about 100.

6. The method of claim 1, wherein etching the portion of the second semiconductor layer comprises:
    etching the portion of the second semiconductor layer with the primary etchant at a first etch rate; and
    etching the portion of the second semiconductor layer with the germanium-containing gas at a second etch rate, wherein a ratio of the first etch rate to the second etch rate ranges from about 1 to about 500.

7. The method of claim 1, further comprising etching the first semiconductor layer with the primary etchant, wherein an etch selectivity between the second semiconductor layer to the first semiconductor layer ranges from about 20 to about 100.

8. The method of claim 1, wherein the germanium-containing gas comprises one of germanium hydride, germanium fluoride, germanium chloride, and germanium hydrofluoride.

9. The method of claim 1, wherein the primary etchant comprises at least one of hydrogen radical, fluorine radical, nitrogen fluoride radical, fluorine, hydrogen fluoride, carbon fluoride, chlorine, and hydrogen chloride.

10. A method, comprising:
forming a fin structure including a fin bottom portion and a stacked fin portion on a substrate, wherein the stacked fin portion comprises a first set of semiconductor layers comprising germanium and a second set of semiconductor layers;
etching the fin structure to form an opening;
delivering a primary etchant and a germanium-containing gas through the opening to the fin structure;
etching a first portion of the second set of semiconductor layers in the opening with the primary etchant and the germanium-containing gas;
forming an inner spacer structure at the first portion; and
etching a second portion of the second set of semiconductor layers adjacent to the inner spacer structure with the primary etchant and the germanium-containing gas.

11. The method of claim 10, further comprising forming a gate structure wrapping around the first set of semiconductor layers at the second portion of the second set of semiconductor layers.

12. The method of claim 10, wherein forming the fin structure comprises forming the second set of semiconductor layers with silicon germanium having germanium in a range from about 40 atomic percent to about 100 atomic percent.

13. The method of claim 10, wherein delivering the primary etchant and the germanium-containing gas comprises:
delivering the primary etchant at a first flow rate; and
delivering the germanium-containing gas at a second flow rate, a ratio of the second flow rate to the first flow rate ranges from about 0.1 to about 100.

14. The method of claim 10, wherein etching the first portion of the second set of semiconductor layers comprises:
etching the first portion of the second set of semiconductor layers with the primary etchant at a first etch rate; and
etching the first portion of the second set of semiconductor layers with the germanium-containing gas at a second etch rate, wherein a ratio of the first etch rate to the second etch rate ranges from about 1 to about 500.

15. The method of claim 10, further comprising etching an end portion of the first set of semiconductor layers with the primary etchant, wherein an etch selectivity between the second set of semiconductor layers to the first set of semiconductor layers ranges from about 20 to about 100.

16. The method of claim 10, wherein the germanium-containing gas comprises one of germanium hydride, germanium fluoride, germanium chloride, and germanium hydrofluoride.

17. A semiconductor device, comprising:
a nanostructure on a substrate, wherein:
the nanostructure comprises a fin bottom portion on the substrate, an epitaxial substrate layer in direct contact with the fin bottom portion, and a plurality of semiconductor layers on the epitaxial substrate layer, and
each of the plurality of semiconductor layers comprises germanium;
a gate structure wrapped around a portion of the plurality of semiconductor layers;
an epitaxial fin region on a top surface of the epitaxial substrate layer and in contact with end portions of the plurality of semiconductor layers; and
an inner spacer structure adjacent to the gate structure and between the plurality of semiconductor layers, wherein the inner spacer structure comprises:
a first end portion having a first height adjacent to an end of the plurality of semiconductor layers;
a second end portion having a second height adjacent to the gate structure, wherein the second end portion is opposite to the first end portion; and
a width between the first end portion and the second end portion, wherein a ratio of a difference between the first height and the second height to the width is less than about 0.3.

18. The semiconductor device of claim 17, wherein:
the plurality of semiconductor layers comprises an additional portion adjacent to the inner spacer structure;
the portion of the plurality of semiconductor layers has a first thickness;
the additional portion has a second thickness; and
a ratio of the second thickness to the first thickness ranges from about 10% to about 100%.

19. The semiconductor device of claim 17, wherein:
the plurality of semiconductor layers comprises an additional portion adjacent to the inner spacer structure;
the portion of the plurality of semiconductor layers has a first thickness;
the additional portion has a second thickness; and
a ratio of the second thickness to the first thickness is about 100%.

20. The semiconductor device of claim 17, wherein the plurality of semiconductor layers comprises germanium in a range from about 40 atomic percent to about 100 atomic percent.

* * * * *